US 011784614B2

(12) United States Patent
Zeng et al.

(10) Patent No.: US 11,784,614 B2
(45) Date of Patent: Oct. 10, 2023

(54) RADIO FREQUENCY POWER AMPLIFIER AND METHOD OF ASSEMBLY THEREOF

(71) Applicant: KONINKLIJKE PHILIPS N.V., Eindhoven (NL)

(72) Inventors: Keqiu Zeng, Shanghai (CN); Cong Zhou, Suzhou (CN); Yuanxu Ding, Suzhou (CN); Jungyang Zhang, Suzhou (CN); Jun Ma, Suzhou (CN)

(73) Assignee: Koninklijke Philips N.V., Eindhoven (NL)

( * ) Notice: Subject to any disclaimer, the term of this patent is extended or adjusted under 35 U.S.C. 154(b) by 340 days.

(21) Appl. No.: 16/975,151

(22) PCT Filed: Nov. 8, 2019

(86) PCT No.: PCT/EP2019/080730
§ 371 (c)(1),
(2) Date: Aug. 24, 2020

(87) PCT Pub. No.: WO2020/094858
PCT Pub. Date: May 14, 2020

(65) Prior Publication Data
US 2021/0376803 A1 Dec. 2, 2021

(30) Foreign Application Priority Data

Nov. 9, 2018 (WO) ................ PCT/CN2018/114862
Dec. 13, 2018 (EP) ..................................... 18212228

(51) Int. Cl.
H03F 3/21 (2006.01)
G01R 33/36 (2006.01)
(Continued)

(52) U.S. Cl.
CPC ............ *H03F 3/21* (2013.01); *G01R 33/3614* (2013.01); *H03F 1/30* (2013.01); *H05K 7/2039* (2013.01);
(Continued)

(58) Field of Classification Search
CPC ........ H03F 3/21; H03F 1/30; H03F 2200/447; H03F 2200/451; G01R 33/3614; H05K 7/2039; H05K 9/0007
See application file for complete search history.

(56) References Cited

U.S. PATENT DOCUMENTS 5,966,648 A 10/1999 Ortberg et al.
6,473,314 B1 10/2002 Custer et al.
(Continued)

FOREIGN PATENT DOCUMENTS

| CN | 107015179 A | 8/2017 |
| JP | 2008235775 A | 10/2008 |
| KR | 101588129 B1 | 1/2016 |

OTHER PUBLICATIONS

International Search Report and Written Opinion from PCT/EP2019/080730 dated Mar. 20, 2020.

*Primary Examiner* — G. M. A Hyder

(57) ABSTRACT

Radio frequency amplifier (200) assembly with effective prevention of RF interference. The radio frequency amplifier comprises an electrically conductive housing (301) that defines an enclosed interior of the radio frequency amplifier assembly, an electrically conductive cooling plate (415) disposed inside the electrically conductive housing and having a first side and an opposite second side, the electrically conductive cooling plate being configured to divide the enclosed interior into a first enclosed region (501) and a second enclosed region (503), and a radio frequency signal processing circuit board (223) equipped with a radio frequency signal processing circuit, the radio frequency signal
(Continued)

processing circuit board being positioned in the first enclosed region and disposed on the first side of the electrically conductive cooling plate, and a power supply module and a controller module positioned in the second enclosed region and disposed on the opposite second side of the electrically conductive cooling plate.

15 Claims, 7 Drawing Sheets

(51) Int. Cl.
  *H03F 1/30* (2006.01)
  *H05K 7/20* (2006.01)
  *H05K 9/00* (2006.01)

(52) U.S. Cl.
  CPC ..... *H05K 9/0007* (2013.01); *H03F 2200/447* (2013.01); *H03F 2200/451* (2013.01)

(56) References Cited

U.S. PATENT DOCUMENTS

| | | |
|---|---|---|
| 8,279,614 B2 | 10/2012 | Horten et al. |
| 10,396,720 B2 | 8/2019 | Grede et al. |
| 2013/0147486 A1* | 6/2013 | Albrecht ............ G01R 33/3614 361/717 |
| 2014/0232469 A1 | 8/2014 | Correa et al. |
| 2018/0041172 A1 | 2/2018 | Shoundrabalan et al. |
| 2018/0123526 A1 | 5/2018 | Grede et al. |

* cited by examiner

RADIO FREQUENCY POWER AMPLIFIER AND METHOD OF ASSEMBLY THEREOF

CROSS REFERENCE TO RELATED APPLICATIONS

This application is a U.S. national phase application of International Application No. PCT/EP2019/080730 filed Nov. 8, 2019, which claims the benefit of EP Application Ser. No. 18212228.3 filed Dec. 13, 2018 and PCT/CN2018/114862 filed Nov. 9, 2018 and is incorporated herein by reference.

FIELD OF THE INVENTION

The invention relates to the field of radio freqency (RF) power amplifiers and more particularly to a RF power amplifier assembly for magentic resonance imaging.

BACKGROUND OF THE INVENTION

An RF power amplfier is typically used to convert a low power RF signal into a larger signal of significant power. In the context of a magnetic resonance imaging (MRI) system, the RF power amplifier is connected to RF transmit coils that radiate the RF pulses into the body region to be imaged.

An MRI system is often used for the examination and treatment of patients. By using such a system, the nuclear spins of the body tissue to be examined are aligned by a static main magnetic field $B_0$ and are excited by transverse magnetic fields $B_1$ oscillating in the radiofrequency band. The $B_1$ field is produced by driving electrical currents through specialized RF transmit coils. In nearly all clinical MR imaging applications, the $B_1$ field is transmitted in short 1-5 ms bursts called RF pluses. A RF transmit chain including a frequency synthesizer, a pulse modulator and a RF power amplifier is responsible for generating the electric currents required to produce the $B_1$ field. The RF power amplifier raises the power level of the small input RF pulse up from a milli-Watt range to a level high enough to drive the RF transmit coils. The RF power amplifiers in modern MRI systems typically produce peak power in a wide dynamic range of 0.5 KW-35 KW, e.g., 0.5 KW-2 KW (legs and arms), 4 KW-8 KW head, and up to 35 KW whole body, which makes the RF power amplifier with poor electromagnetic interference compatibility (EMC) performance a tremendous source of RF and spurious emissions. Sensitive electronic components impacted by RF and spurious emissions, such as receiving coils, will degrade the image quality. Furthermore, communication cables and connectors affected by RF and spurious emissions will result in degraded communication between these electronic components. The most severe issue with poor EMC performance of a RF power amplifier is the safety risk imposed on the human body.

To address RF and spurious emissions from the RF power amplifier, U.S. Pat. No. 6,473,314B1 discloses a low cost RF interference filter comprising a multi-layered printed circuit board assembly to prevent RF propagation along the feedthrough which connects isolated PC boards within the RF power amplifier with each other. US2014/0232469A1 discloses a RF power amplifier assembly with some electronic components and power rail arranged within the heat sink. In this arrangement, the heat sink also serves as an EMI shield for RF and spurious emissions for the RF power amplifier. However, EMC performance of existing RF power amplifiers is still not satisfactory for MRI applications.

SUMMARY OF THE INVENTION

From the foregoing, it is readily appreciated that there is a need for a RF power amplifier in MRI applications that provides satisfactory EMC performance. It is consequently an object of the invention to provide a radio frequency amplifier assembly, a method of assembling the radio frequency amplifier and a magnetic resonance imaging system comprising the radio frequency amplifier assembly in the independent claims. Embodiments are given in the dependent claims.

Embodiments of the present invention provide a radio frequency amplifier assembly with effective prevention of RF interference. The radio frequency amplifier comprises an electrically conductive housing that defines an enclosed interior of the radio frequency amplifier assembly, an electrically conductive cooling plate disposed inside the electrically conductive housing and having a first side and an opposite second side, the electrically conductive cooling plate being configured to divide the enclosed interior into a first enclosed region and a second enclosed region, a radio frequency signal processing circuit board equipped with a radio frequency signal processing circuit, the radio frequency signal processing circuit board being positioned in the first enclosed region and disposed on the first side of the electrically conductive cooling plate; and a power supply module and a controller module positioned in the second enclosed region and disposed on the opposite second side of the electrically conductive cooling plate.

In addition to dissipating the heat generated by the radio frequency power amplifier, the electrically conductive cooling plate further serves as a shielding barrier for dividing the interior of the radio frequency power amplifier into multiple shielded regions which are isolated from each other. Furthermore, in one embodiment, the electrically conductive cooling plate can be in physical and/or electrical contact with the electrically conductive housing, which is configured to be grounded, thereby further serving as a grounding plate. The first enclosed region is dedicated for the radio frequency signal processing circuit board and the second enclosed region is dedicated for the power supply module and the controller module. In such an arrangement, the isolated layout and grounding between different modules and a shortened cable routing of such an arrangement entail satisfactory EMC performance of the RF power amplifier assembly, without materially introducing any new component or cost.

According to one embodiment of the present invention, the radio frequency amplifier assembly further comprises a grounding path secured between the radio frequency signal processing circuit board and the electrically conductive housing. Advantageously, the grounding path provides a shortened grounding connection that eliminates the common mode current significantly and allows the common mode current to flow to nearby ground directly instead of flowing around the whole RF power amplifier assembly 300.

According to another embodiment of the present invention, the grounding path further comprises a metallic plate electrically connected to a ground area in a vicinity of an output port of the radio frequency signal processing circuit board and an RF output connector. The RF output connector comprises an electrically conductive annular flange inserted through the metallic plate and a fastening member extending outwardly from the electrically conductive annular flange and being secured to the electrically conductive housing. Advantageously, the grounding path provides a grounding connection which is as short as possible and the RF output connector structured with the through-hole electrically conductive annular flange ensures effective mating of the grounding path.

According to yet another embodiment of the present invention, the radio frequency amplifier assembly further comprises a shielding enclosure disposed on the electrically conductive cooling plate and enclosing the radio frequency signal processing circuit board. The shielding enclosure, the electrically conductive cooling plate and the radio frequency signal processing circuit board are integrally formed as a radio frequency shielded cabinet detachably disposed inside the electrically conductive housing. Advantageously, the shielding enclosure and the electrically conductive housing provide a two-layer shielding for the radio frequency signal processing board, which can further enhance the EMC performance of the radio frequency amplifier assembly.

According to yet another embodiment of the present invention, the radio frequency amplifier assembly further comprises at least a shielding bar disposed on the radio frequency signal processing circuit board and configured to divide an interior of the shielded cabinet into a plurality of shielded regions. Advantageously, electromagnetic radiation is further shielded from being transmitted between these shielded regions and the EMC performance is further enhanced.

According to yet another embodiment of the present invention, the shield shielded regions comprise a first shielded region dedicated for enclosing cables and connectors. Consequently, the cables and connectors, which are a significant cause of EMC issues, are taken care of by providing a dedicated shielded region.

According to yet another embodiment of the present invention, the shield shielded regions comprise a second shielded region enclosing a driver of the radio frequency signal processing circuit and a third shielded region enclosing a final stage and a directional coupler of the radio frequency signal processing circuit.

According to yet another embodiment of the present invention, the electrically conductive housing is configured to be grounded. As a result, the grounded electrically conductive housing serves as a chassis ground of the radio frequency amplifier assembly.

Embodiments of the present invention further provide a method for assembling a radio frequency amplifier. The method comprises the steps of disposing an electrically conductive cooling plate inside an electrically conductive housing to divide an enclosed interior defined by the electrically conductive housing into a first enclosed region and a second enclosed region (503); disposing a radio frequency signal processing circuit board equipped with a radio frequency signal processing circuit on the first side of the electrically conductive cooling plate and in the first enclosed region; and disposing a power supply module and a controller module on the opposite second side of the electrically conductive cooling plate and in the second enclosed region.

According to one embodiment of the present invention, the method further comprises disposing a shielding enclosure on the electrically conductive cooling plate to enclose the radio frequency signal processing circuit board. The shielding enclosure, the electrically conductive cooling plate and the radio frequency signal processing circuit board are integrally formed as a radio frequency shielded cabinet detachably mounted inside the electrically conductive housing.

According to another embodiment of the present invention, the method further comprises disposing a plurality of shielding bars on the radio frequency signal processing circuit board to divide an interior of the shielded cabinet into a plurality of shielded regions.

According to yet another embodiment of the present invention, the plurality of shielded regions comprises a first shielded region dedicated for enclosing cables and connectors.

According to yet another embodiment of the present invention, the method further comprises securing a grounding path between the radio frequency signal processing circuit and the electrically conductive housing, which is configured to shorten a ground connection for the radio frequency amplifier.

According to yet another embodiment of the present invention, the method further comprises grounding the electrically conductive housing.

Embodiments of the present invention further provide a magnetic resonance imaging system comprising a radio frequency amplifier assembly.

DESCRIPTION OF THE DRAWINGS

The present invention will be described and explained hereinafter in more detail in combination with embodiments and with reference to the drawings, wherein.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn to scale for illustrative purposes.

DETAILED DESCRIPTION

Like numbered elements in these figures are either equivalent elements or they perform the same function.

Elements which have been discussed previously will not necessarily be discussed in later figures if the function is equivalent.

Figure 1:
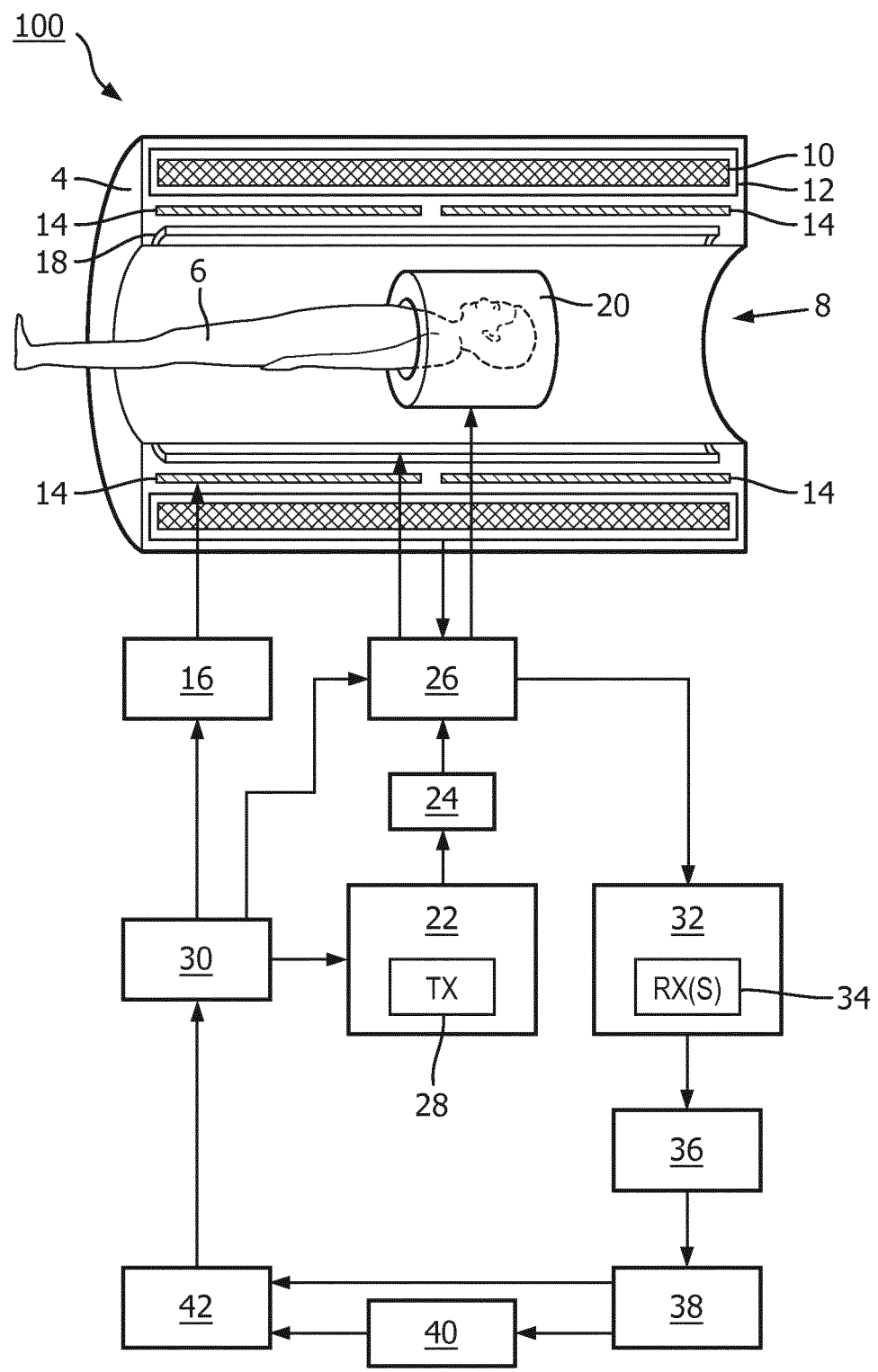
FIG. 1 illustrates a magnetic resonance imaging (MRI) system using a RF power amplifier according to one embodiment of the present invention.

FIG. 1 illustrates a magnetic resonance imaging (MRI) system 100 that excites nuclei (e.g., associated with isotopes such as IH, 19F, I3C, 31p, etc.) within a subject using a RF power amplifier. The system 100 includes a housing 4. A subject 6 (e.g., a human, an object, etc.) is at least partially disposed within a bore 8 of the housing 4 for one or more MRI procedures (e.g., spin echo, gradient echo, stimulated echo, etc.). A magnet 10 resides in the housing 4. The magnet 10 typically is a persistent superconducting magnet surrounded by a cryo shrouding 12. However, other known magnets (e.g., a resistive magnet, a permanent magnet, etc.) can be employed. The magnet 10 produces a stationary and substantially homogeneous main magnetic field B0 in the subject 6. As a result, the nuclei within the subject 6 preferentially align in a parallel and/or an anti-parallel direction with respect to the magnetic flux lines of the magnetic field B0. Typical magnetic field strengths are about 0.5 Tesla (0.5 T), 1.0 T, 1.5 T, 3 T or higher (e.g., about 7 T).

Magnetic field gradient coils 14 are arranged in and/or on the housing 4. The coils 14 superimpose various magnetic field gradients G on the magnetic field B0 in order to define an imaging slice or volume and to otherwise spatially encode excited nuclei. Image data signals are produced by switching gradient fields in a controlled sequence by a gradient controller 16. One or more radio frequency (RF) coils or resonators are used for single and/or multi-nuclei excitation pulses within an imaging region. Suitable RF coils include a full body coil 18 located in the bore 8 of the system 2, a local coil (e.g., a head coil 20 surrounding a head of the subject 6), and/or one or more surface coils.

An excitation source 22 generates the single and/or multi-nuclei excitation pulses and provides these pulses to the RF coils 18 and/or 20 through a RF power module 24 and a switch 26. The excitation source 22 includes at least one transmitter (TX) 28.

A scanner controller 30 controls the excitation source 22 based on operator instructions. For instance, if an operator selects a protocol for acquisition of proton spectra, the scanner controller 30 accordingly instructs the excitation source 22 to generate excitation pulses at a corresponding frequency, and the transmitter 28 generates and transmits the pulses to the RF coils 18 or 20 via the RF power amplifier 24. The single or multi-nuclei excitation pulses are fed to the RF power amplifier 24. Conventional MRI systems typically utilize multiple amplifiers, in case more than one excitation spectrum is used.

The single or multi-nuclei excitation pulses are sent from the RF power amplifier 24 to the coils 18 or 20 through the switch 26. The scanner controller 30 also controls the switch 26. During an excitation phase, the scanner controller 30 controls the switch 26 and allows the single or multi-nuclei excitation pulses to pass through the switch 26 to the RF coils 18 or 20, but not to a receive system 32. Upon receiving the single or multi-nuclei excitation pulses, the RF coils 18 or 20 resonate and apply the pulses into the imaging region. The gradient controller 16 suitably operates the gradient coils 14 to spatially encode the resulting MR signals.

During the readout phase, the switch 26 connects the receive system 32 to one or more receive coils to acquire the spatially encoded MR signals. The receive system 32 includes one or more receivers 34, depending on the receive coil configuration. The acquired MR signals are conveyed (serially and/or in parallel) through a data pipeline 36 and processed by a processing component 38 to produce one or more images.

The reconstructed images are stored in a storage component 40 and/or displayed on an interface 42, other display device, printed, communicated over a network (e.g., the Internet, a local area network (LAN) . . . ), stored within a storage medium, and/or otherwise used. The interface 42 also allows an operator to control the magnetic resonance imaging scanner 2 through conveying instructions to the scanner controller 30.

Figure 2:
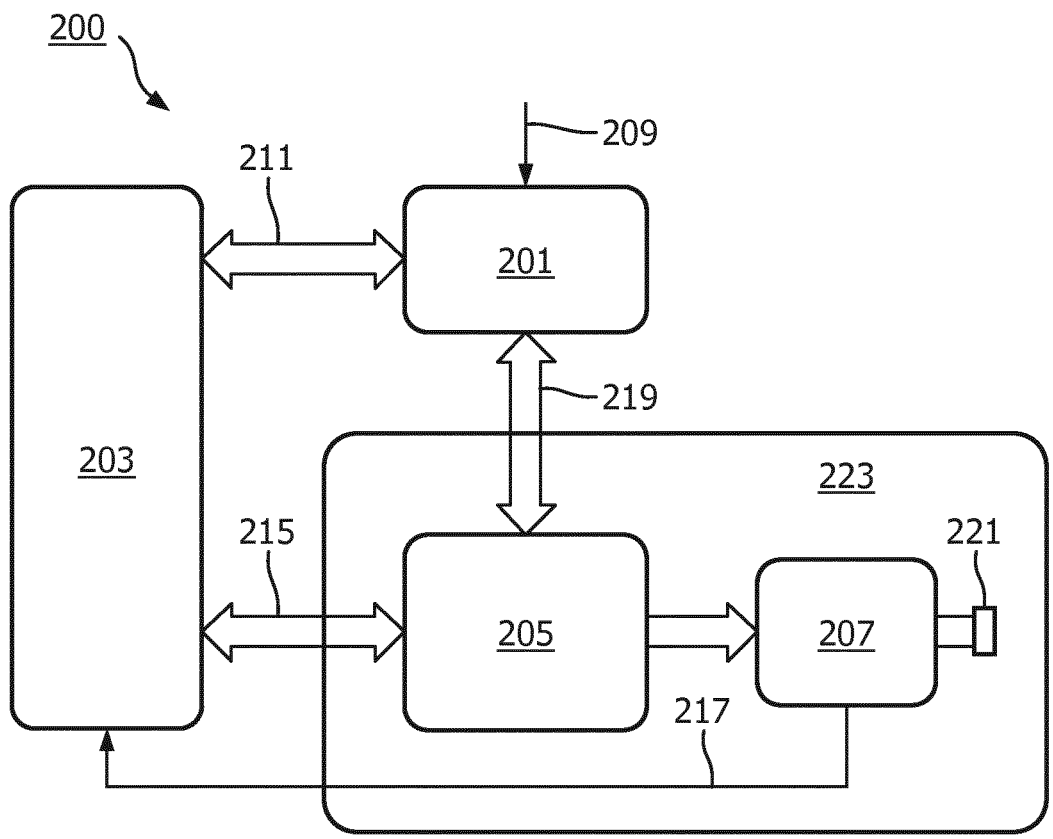
FIG. 2 illustrates a schematic diagram of a RF power amplifier according to one embodiment of the present invention.

FIG. 2 illustrates a schematic diagram of a RF power amplifier 200 according to one embodiment of the present invention. The RF power amplifier 200 includes a power supply unit (PSU) 201, a controller 203, a driver and final stage 205 and a directional coupler 207. The PSU 201 receives AC power supply from cable 209 and converts the AC power to DC powers to power various electronic components of the RF power amplifier 200. The controller 203 is connected to the PSU 201, the driver and final stage 205 and the directional coupler 207 through cables 211, 215 and 217, respectively. Powered by a low DC voltage from the PSU 201, the controller 203 reads, monitors and controls the status of each RF stage and is responsible for the overall system operation, including the distribution of power to the various components of the RF power amplifier. For example, controlled by the controller 203, the PSU 201 provides a high DC voltage to the driver and final stage 205 through a cable 219. The driver and final stage 205 amplifies the power of an RF input pulse received from the controller 203 to output a desired power level at an RF output 221. The directional coupler 207 is further connected to the RF output 221 to separate out precise, proportional samples of forward and reflected signal power for internal and/or external power monitoring and fault detection of the controller 203.

As circuitry and wiring of the RF power amplifier 200 can generate EMI that affects the operation of various electric components, shielding and layout of the circuitry and wring need to be well designed to achieve an acceptable EMC performance. In addition to the EMC issue, a cooling mechanism needs to be provided to dissipate the heat generated by the RF power amplifier. Accordingly, embodiments of the present invention provide an RF power amplifier assembly that addresses these issues. In the embodiment of FIG. 2, a RF signal processing board 223 equipped with the RF signal processing circuit comprising the driver and final stage 205 and the directional coupler 207 is formed. The electrical components of the RF signal processing circuit can be embedded in the RF signal processing board 223 by direct soldering and/or mounting onto the RF signal processing board 223 in a socket form. Alternatively, the electric components of the RF signal processing circuit are placed on different printed circuit boards. For example, the driver is placed on a first PCB, while the final stage and the directional coupler are placed on a second PCB. Other arrangements of the components on one or more printed circuit boards are contemplated by the disclosure and are included within the scope of the disclosure. Considering that the electric components of the RF signal processing circuit are more sensitive to electromagnetic interference, the electric components of the RF signal processing circuit are further disposed in a first enclosed region within the RF power amplifier assembly, and the PSU 201 and the controller 203 are disposed in a second enclosed region within the RF power assembly. The first enclosed region is isolated from the second enclosed region, which will be described in more detail with reference to FIGS. 3 and 4. In such an arrangement, the grounding paths of different electric modules are well isolated and cross disturbance among different electric modules is reduced.

Figure 3:
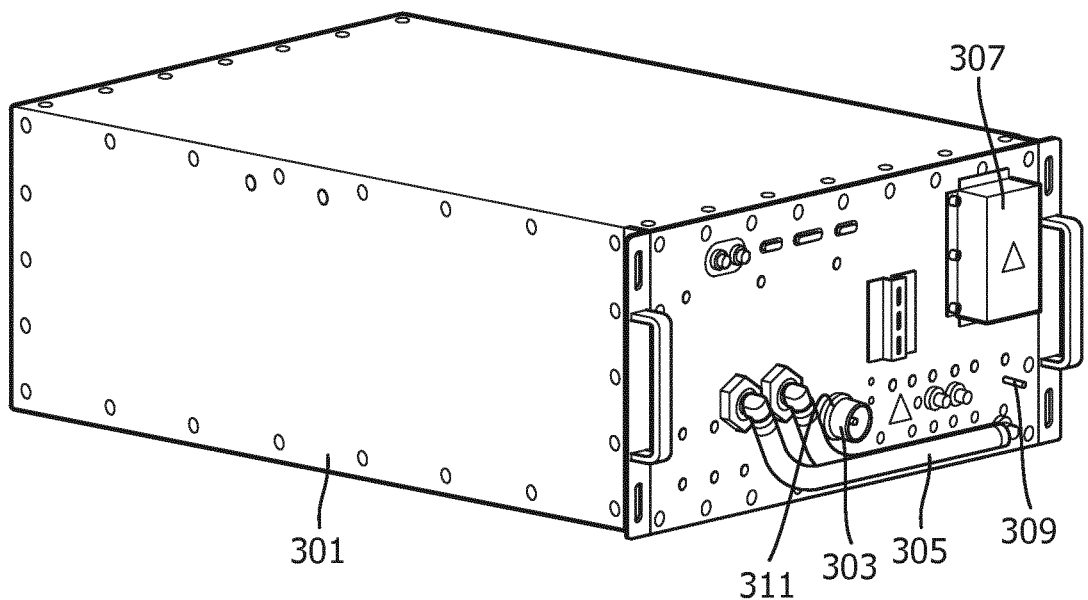
FIG. 3 illustrates a perspective view of a RF power amplifier according to one embodiment of the present invention.
Figure 4:
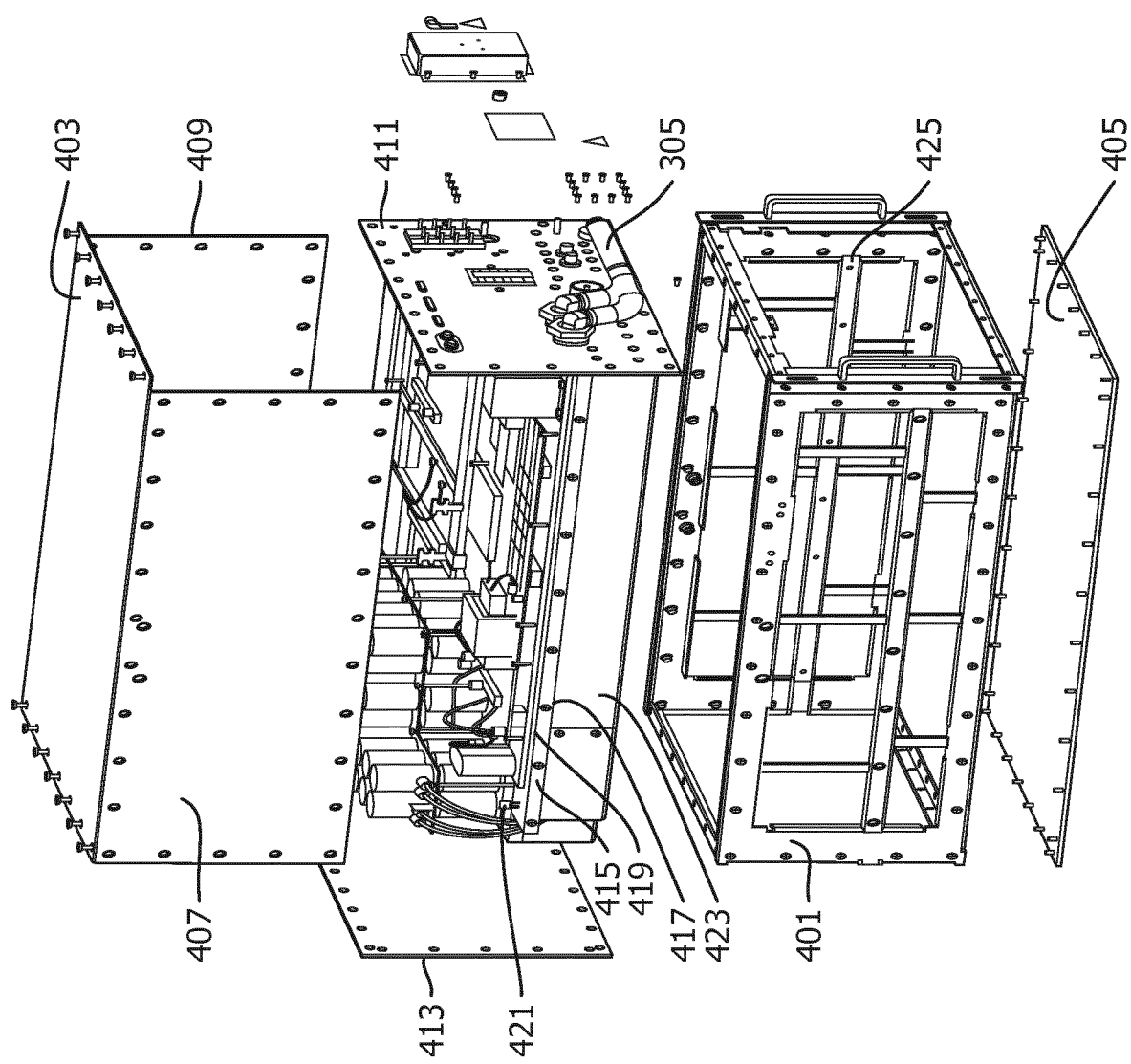
FIG. 4 illustrates an exploded perspective view of a RF power amplifier assembly according to one embodiment of the present invention.

Referring now to FIG. 3 and FIG. 4, a perspective view and an exploded perspective view of a RF power amplifier assembly 300 according to one embodiment of the present invention are disclosed. For the sake of conciseness and readability, descriptions of well-known functions or constructions are omitted. The RF power amplifier assembly 300 includes an electrically conductive housing 301 defining an enclosed interior of the RF power amplifier assembly 300. In the embodiment of FIG. 3 and FIG. 4, the electrically conductive housing 301 defines a substantially cuboidal interior for the purpose of illustration but not limitation, and the skilled in the art acknowledges that any other shape can be contemplated as long as the enclosed interior is formed. Turning to the embodiment of FIG. 4, the electrically conductive housing 301 includes a mounting frame 401, top and bottom walls 403 and 405, left and right walls 407 and 409, and front and rear walls 411 and 413, all of which are made of electrically conductive materials, e.g., metal. The walls 403 to 413 are mounted to the mounting frame 401 and assembled together to form a surface wall of the electrically conductive housing 301 that defines the enclosed interior of the RF power amplifier assembly 300. It shall be acknowledged that the surface wall of the electrically conductive housing 301 is not necessarily formed by assembling individual walls 403 to 413 together, but can be integrally formed as a box configuration in any shape as long as the enclosed interior is formed. For the purpose of illustration, the part of the surface wall of the electrically conductive housing 301 for interacting with external components and devices is referred to as the front wall 411. The part opposite to the front wall is referred to as the rear wall. The front and rear walls are spaced apart by opposing top and bottom walls, and opposing left and right walls.

Figure 5:
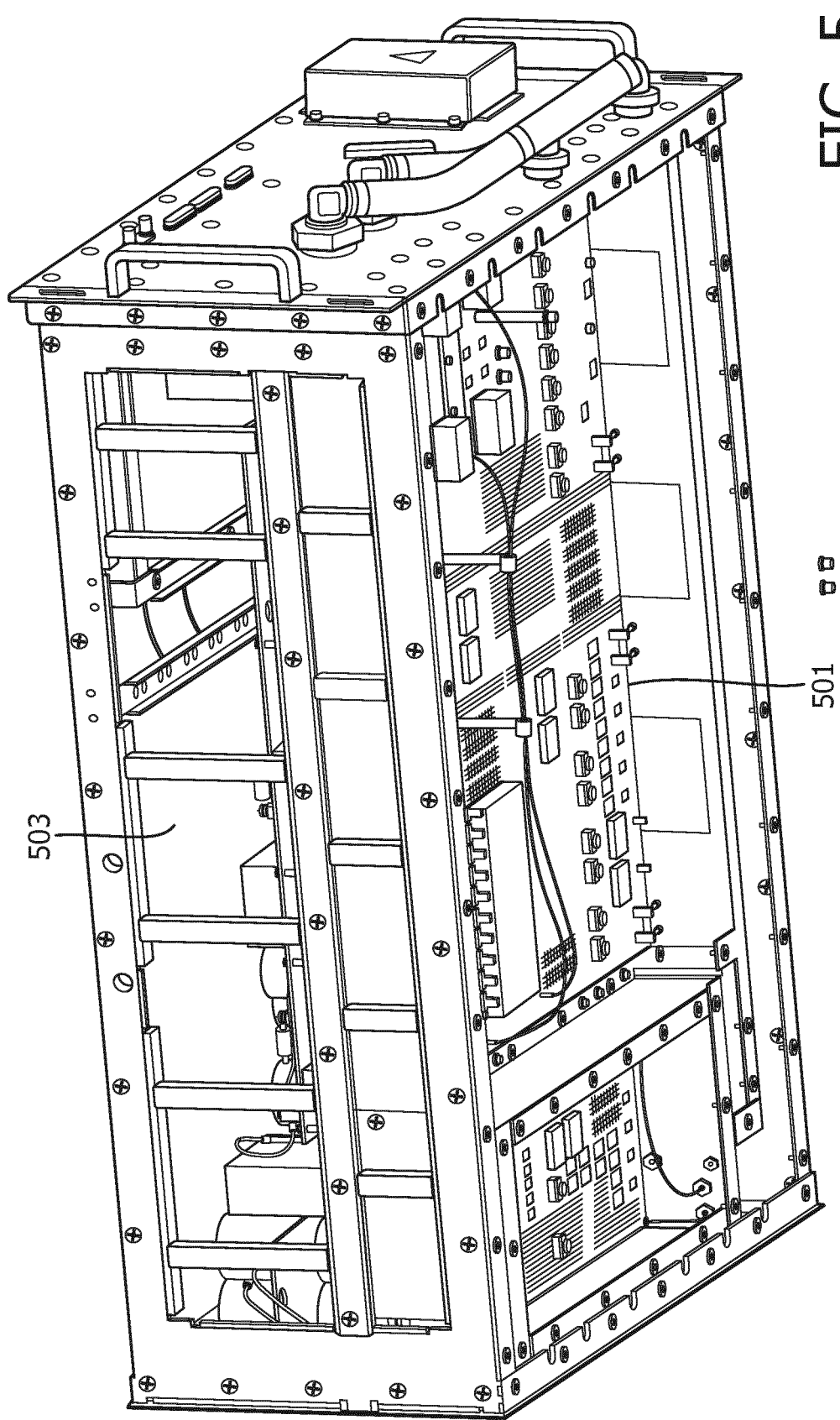
FIG. 5 illustrates a perspective view of a RF power amplifier assembly of which a surface wall has been removed for visibility of the enclosed interior according to one embodiment of the present invention.

Mounted on the front wall 411 are an RF output connector 303, a cooling hose 305, an AC power box 307 and a grounding stud 309. The AC power box 307 receives an AC power supply from an external AC power source (not shown). The grounding stud 309 is configured to be connected to earth ground of the AC power supply to ground the electrically conductive housing 301. The RF output connector 303 is disposed in a through-hole 311 of the front wall 411 and is configured to be connected to an output load, e.g., RF transmit coils for MR applications. The cooling hose 305 is connected to an electrically conductive cooling plate 415 disposed inside the electrically conductive housing 301 to provide a coolant for cooling the RF power amplifier assembly 300. Turning to FIG. 4, it is shown that the electrically conductive cooling plate 415 is mounted to the front wall 411 with apertures for inlet and outlet connection to the cooling hose 305. Spaced between the top wall 403 and the bottom wall 405 and extending in a left-right direction towards left and right walls 407 and 409 and in a front-rear direction towards front and rear walls 411 and 413, the electrically conductive cooling plate 415 divides the enclosed interior of the electrically conductive housing 301 into a first enclosed region 501 and a second enclosed region 503 lying on opposite sides thereof and shields electromagnetic radiation from being transmitted between the two enclosed regions 501 and 503, as shown in FIG. 5. FIG. 5 illustrates a perspective view of the RF power amplifier assembly 300 with the surface walls 403 to 413 removed for visibility of the enclosed interior. The RF signal processing circuit board 223 is disposed on a first side 417 of the electrically conductive cooling plate 415 and positioned in the first enclosed region 501. The PSU 201 and controller 203 are disposed on a second side 419 of the electrically conductive cooling plate 415 and positioned in the second enclosed region 503. The electrically conductive cooling plate 415 is in a rectangle shape with one or more recesses 421 at corners. When mounted to the electrically conductive housing 301, sides of the electrically conductive cooling plate 415 are in physical and electrical contact with the surface walls in the left-right and front-rear directions except for one or more openings formed at the one or more recesses 415. Cables from PSU 201 and controller 203 are connected to the RF signal processing circuit board 223 through the one or more openings which results in a shortened cable route.

In such an arrangement, in addition to serving as a heat sink, the electrically conductive cooling plate 415 in physical and electrical contact with the grounded electrically conductive housing 301 further serves as a grounding plate that substantially isolates the first enclosed region 501 from the second enclosed region 503. The isolated layout and grounding between different modules and a shortened cable routing of such arrangement entail satisfactory EMC performance of the RF power amplifier assembly 300. Furthermore, such arrangement also provides a simplified cable route that permits ease of cable maintenance and management. It shall be contemplated by the skilled in the art that the electrically conductive cooling plate 315 can be arranged inside the electrically conductive housing 301 and spaced apart between a first wall and an opposite second wall, or between a first wall and a second wall intersecting with the first wall, or the like, as long as two enclosed regions 501 and 503 materially isolated from each other are formed.

In the embodiment of the RF power amplifier assembly 300, a shielding enclosure 423 is further disposed on the electrically conductive cooling plate 415 to enclose the RF signal processing circuit board 223. In such an arrangement, a two-layer shielding provided by the electrically conductive housing 301 and the shielding enclosure 423 is employed to further improve the EMC performance. To simplify the assembling of the RF power amplifier assembly, the shielding enclosure 423, the electrically conductive cooling plate 415 and the radio frequency signal processing circuit board 223 are integrally formed as a radio frequency shielded cabinet 600, as shown in FIG. 6.

Figure 6:
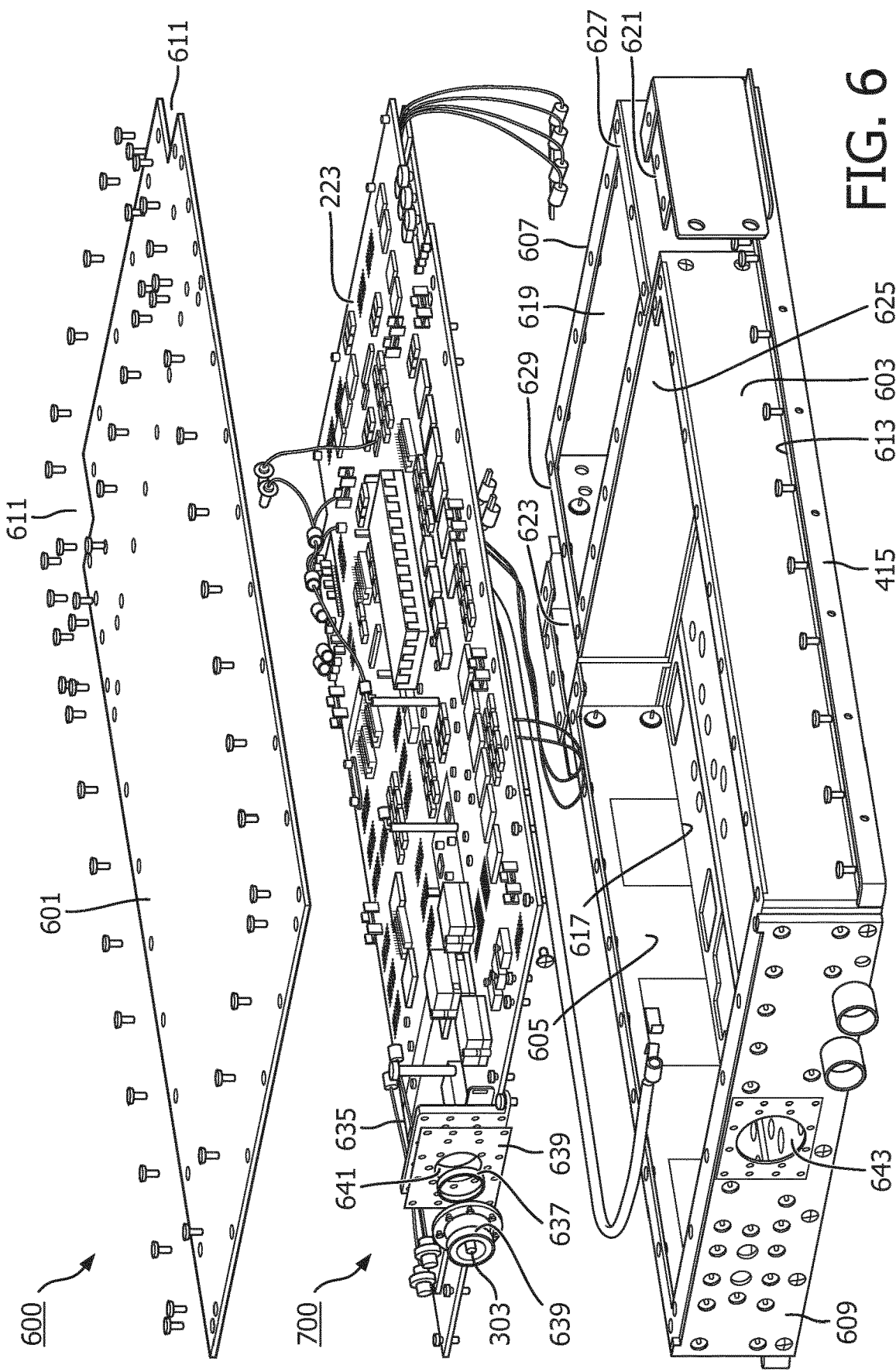
FIG. 6 illustrates an exploded perspective view of a radio frequency shielded cabinet according to one embodiment of the present invention.

FIG. 6 illustrates an exploded perspective view of the radio frequency shielded cabinet 600. As shown in FIG. 6, the shielding enclosure 423 includes an electrically conductive top plate 601, electrically conductive left plate 603, electrically conductive right plate 605, electrically conductive rear plate 607, and electrically conductive front plate 609. The electrically conductive cooling plate 415 further serves as an electrically conductive bottom plate of the radio frequency shielded cabinet 600 and is spaced apart from the electrically conductive top plate 601 by opposing electrically conductive left and right plates 603 and 607 and opposing electrically conductive front and rear plates 609 and 605. Accordingly, a confined interior of the radio frequency shielded cabinet 600 is defined to enclose the radio frequency signal processing circuit board 223 disposed on the electrically conductive cooling plate 415. In the embodiment of FIG. 6, the electrically conductive top plate 601 has a shape substantially identical to that of the electrically conductive cooling plate 415, i.e. a rectangle shape with one or more recess 611 at corners of the rectangle. The electrically conductive left plate 603, electrically conductive right plate 605, electrically conductive rear plate 607, and electrically conductive front plate 609 are mounted on the electrically conductive cooling plate 415 along the edges.

The left and right edges of electrically conductive cooling plate 415 extend beyond the electrically conductive left plate and right plate 603 and 605, respectively, to form extending end portions 613. The extending end portions 613 mate with the mounting grooves 425 in FIG. 4, allowing the radio frequency shielded cabinet 600 to be attached to and detached from the mounting frame 401. By framing the shielded RF module of the RF power amplifier, thus forming the radio frequency shielded cabinet 600, the shielded RF module can be directly attached to and detached from the RF power amplifier assembly in its entirety, resulting in a simplified assembling process, reduced assembling time and ease of maintenance.

As shown in FIG. 6, the confined interior of the radio frequency shielded cabinet 600 is further divided into multiple shielded regions 617, 619, 621 and 623 separated from each other by shielding bars 625, 627 and 629. More specifically, the shielding bar 625 isolates the shielded region 619 from the shielded region 617. Electric components of the driver can be shielded in the shielded region 619, and electric components of the final stage and the directional coupler can be shielded in the shielded region 617. Similarly, the shielding bars 627 and 629 are arranged to form the shielded regions 621 and 623 dedicated for shielding the cable and connectors from the RF signal processing circuit. Owing to the multiple shielded regions 617, 619, 621 and 623, electromagnetic radiation is further shielded from being transmitted between these shielded regions and the EMC performance is further enhanced.

As the area adjacent to the RF output 221 is more subject to electromagnetic interference, in one embodiment, a unique grounding path 700 in the vicinity of the RF output 221 is further introduced to shorten the grounding connection between the ground plane on the RF signal processing circuit board 223 and the electrically conductive housing 301. The shortened grounding path 700 can eliminate the common mode current significantly and allows the common mode current to flow into the nearby ground directly instead of flowing around the whole RF power amplifier assembly 300. As the common mode current is also a source of radiation interference, the significantly reduced common mode current resulting from the shortened grounding path can effectively prevent conduction and radiation of RF interference between sections of the RF power amplifier assembly 300.

Figure 7:
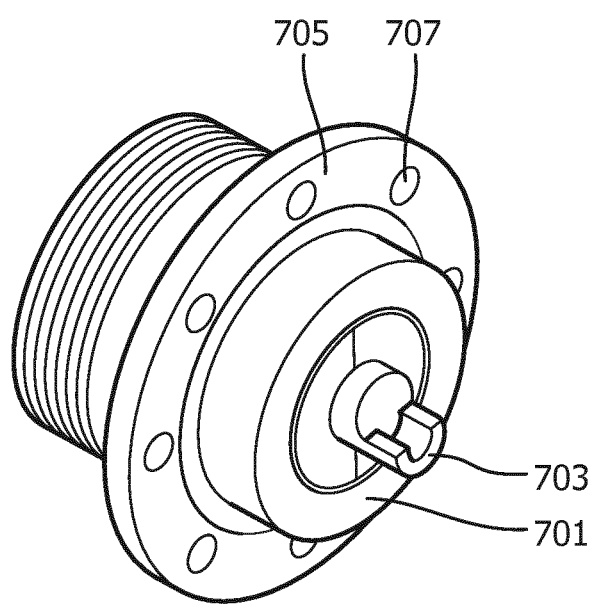
FIG. 7 illustrates a perspective view of a RF output connector according to one embodiment of the present invention.

In the embodiment of FIG. 6, a portion of the shortened grounding path 700 comprises a metallic plate 635 and the RF output connector 303. The metallic plate 635 comprises a mating hole 641 to be mated with the RF output connector 303. Optionally, to ensure effective mating for the grounding connection, a gasket 637 and a metallic sheet 639 serve as a mechanical seal that fills the space between mating surfaces of the metallic plate 635 and the RF output connector 303. Unlike commonly used RF output connectors having an electrically conductive flange in rectangle shape, the RF output connector 303 comprises an electrically conductive annular flange 701 surrounding an inner conductor 703, as shown in FIG. 7. A fastening member 705 extends outwardly in a radial direction from an outer surface of electrically conductive annular flange 701. A plurality of fastening holes 707 extend axially through the fastening member 705. The outer surface of the electrically conductive annular flange 701 of the RF output connector 303 mates with the surface of the mating hole 641 in the metallic plate 635. The gasket 637 is optionally arranged between the mating surfaces to ensure effective mating. The metallic plate 635 and the RF output connector 303 are secured to the electrically conductive front plate 609 and placed on opposite sides. The electrically conductive annular flange 701 provides a through-hole structure and is inserted through a mating hole 643 in the electrically conductive front plate 609 and the mating hole 641 in the metallic plate 635. The metallic sheet 639 is optionally arranged between the metallic plate 635 and the electrically conductive front plate 609 to ensure effective mating of the grounding connection. The circular shape of the fasting member 705 is easier to make and can be provided with more drilled fastening holes through which screws or other fasteners are inserted to secure the RF output connector 303 to the electrically conductive front plate 609. The circular outer surface of the fasting member mates with a surface of the through-hole 311 of the front wall 411 in FIG. 3. In this way, the portion of the grounding path 700 comprising the metallic plate 635, the gasket 637, the metallic sheet 639 and the RF output connector 303 is electrically connected to the electrically conductive housing 301. In this arrangement of FIG. 6, the RF output connector 303 is fastened to the electrically conductive front plate 609 and serves as a component of the radio frequency shielded cabinet 600, leading to a simplified assembling process and reduced assembling time of the RF power amplifier assembly 300. Alternatively, the RF output connector 303 can be fastened to the front wall 411 by securing the fasting member 705 to the front wall 411 and inserting the electrically conductive annular flange 701 through the through-hole 311. In this arrangement, the outer surface of the electrically conductive annular flange 701 mates with the surface of the through-hole 311. Such an arrangement can be adopted when a satisfactory EMC performance does not require a two-layer shielding scheme. That is, without the shielding enclosure 421, the RF output connector 303 can be installed directly to the front wall 411.

Figure 8:
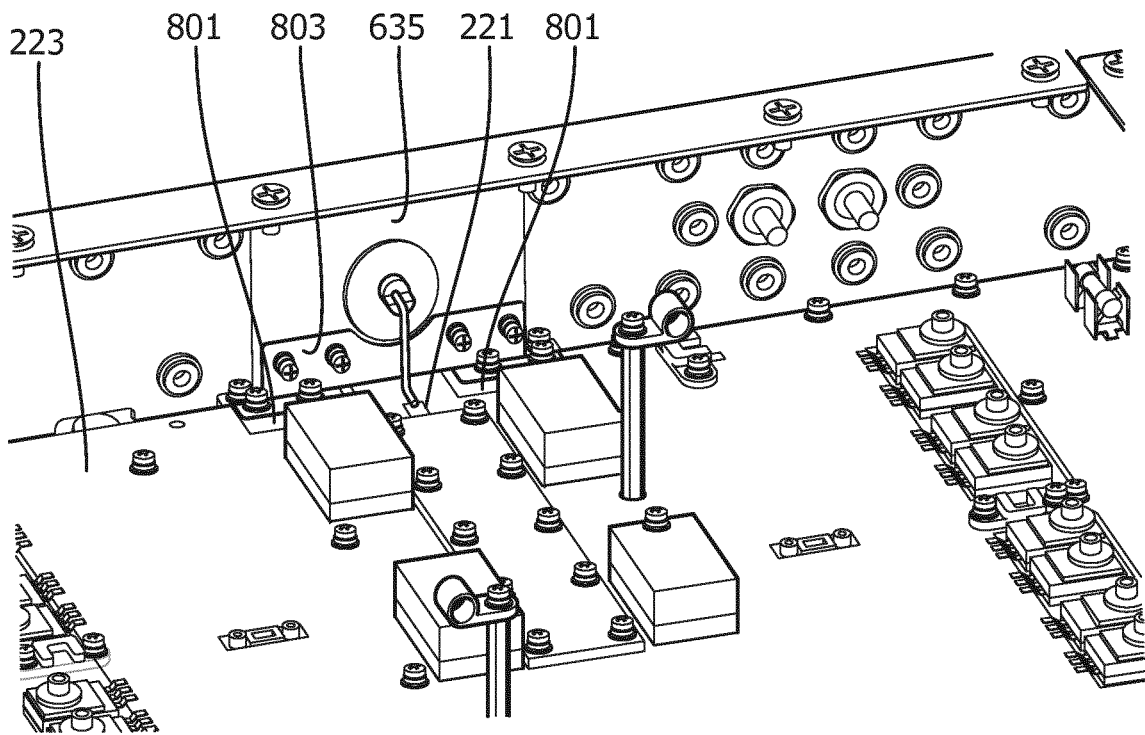
FIG. 8 illustrates a portion of a grounding path that connects to a RF signal processing circuit board according to one embodiment of the present invention.

FIG. 8 illustrates another portion of the shortened grounding path 700 that connects to the RF signal processing circuit board 223. In the embodiment of FIG. 8, the metallic plate 635 is electrically connected to a ground area 801 of a ground plane on the RF signal processing circuit board 223 through an L-shaped metallic piece 803 screwed therebetween. The ground plane on a printed circuit board is a large area or layer of copper foil connected to the circuit's ground point, usually one terminal of the power supply, covering most of the area of the printed circuit board which is not occupied by circuit traces. It serves as the return path for current from many different components. To ensure that the grounding path 700 is as short as possible in the vicinity of the output port 221, the ground area 801 of the ground plane is positioned in the vicinity of the output port 221 of the radio frequency signal processing circuit. Instead of employing the screwed L-shaped metallic piece 803 to establish an electrical connection between the ground area 801 and the metallic plate 635, it can be contemplated by the skilled in the art that many alternative solutions exist for establishing such an electrical connection.

Figure 9:
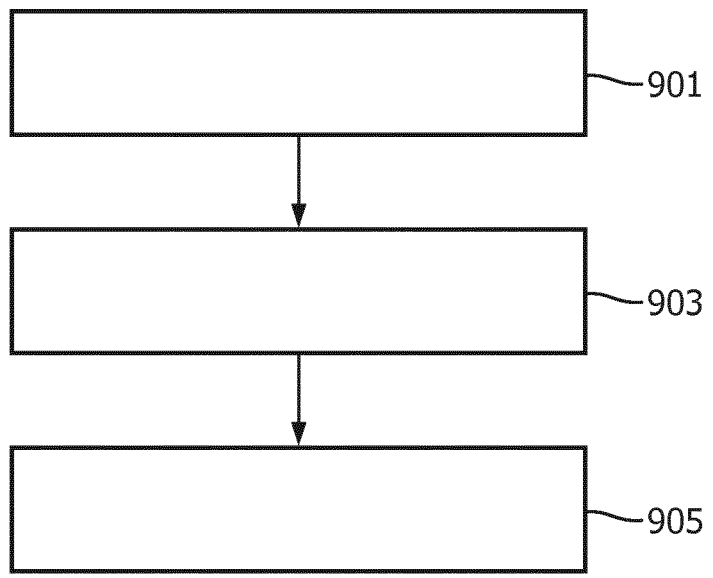
FIG. 9 illustrates a method for assembling a RF power amplifier according to one embodiment of the present invention.

FIG. 9 illustrates a method for assembling the RF power amplifier according to one embodiment of the present invention. At step 901, an electrically conductive cooling plate is disposed inside an electrically conductive housing and spaced between the top and bottom side of the electrically conductive housing to divide an enclosed interior defined by the electrically conductive housing into a first enclosed region and a second enclosed region. Referring back to FIGS. 3, 4 and 5, the electrically conductive cooling plate 315 is disposed inside the electrically conductive housing 301 to divide the enclosed interior into the first enclosed region 501 and the second enclosed region 503. At step 903, a radio frequency signal processing circuit board embedded with a radio frequency signal processing circuit is disposed on the first side of the electrically conductive cooling plate and in the first enclosed region. As shown in FIG. 5, the radio frequency signal processing circuit board 223 is disposed on the first side 417 of the electrically conductive cooling plate 315 and in the first enclosed region 501. At step 905, a power supply module and a controller module are disposed on the opposite second side of the electrically conductive cooling plate and in the second enclosed region. As shown in FIG. 5, the power supply module 203 and a controller module 201 are disposed on the opposite second side 419 of the electrically conductive cooling plate 315 and in the second enclosed region 503.

The embodiments described above are illustrative examples and it should not be construed that the present invention is limited to these particular embodiments. Thus, various changes and modifications may be effected by one skilled in the art without departing from the spirit or scope of the invention as defined in the appended claims.

The invention claimed is:

1. A radio frequency amplifier assembly comprising:
    an electrically conductive housing defining an enclosed interior of the radio frequency amplifier assembly;
    an electrically conductive cooling plate disposed inside the electrically conductive housing and having a first side and an opposite second side, the electrically conductive cooling plate being configured to divide the enclosed interior into a first enclosed region and a second enclosed region;
    a radio frequency signal processing circuit board equipped with a radio frequency signal processing circuit, the radio frequency signal processing circuit board being positioned in the first enclosed region and disposed on the first side of the electrically conductive cooling plate; and
    a power supply module and a controller module positioned in the second enclosed region and disposed on the opposite second side of the electrically conductive cooling plate.

2. The radio frequency amplifier assembly of claim 1, further comprising:
    a grounding path secured between the radio frequency signal processing circuit board and the electrically conductive housing to provide a shortened grounding connection.

3. The radio frequency amplifier assembly of claim 2, wherein the grounding path further comprises a metallic plate electrically connected to a ground area in the vicinity of an output port of the radio frequency signal processing circuit board and an RF output connector, wherein the RF output connector comprises an electrically conductive annular flange inserted through the metallic plate and a fastening member extending outwardly from the electrically conductive annular flange and being secured to the electrically conductive housing.

4. The radio frequency amplifier assembly of claim 1, further comprising:
    a shielding enclosure disposed on the electrically conductive cooling plate and enclosing the radio frequency signal processing circuit board, wherein the shielding enclosure, the electrically conductive cooling plate and the radio frequency signal processing circuit board are integrally formed as a radio frequency shielded cabinet detachably disposed inside the electrically conductive housing.

5. The radio frequency amplifier assembly of claim 4, further comprising:
    at least a shielding bar disposed on the radio frequency signal processing circuit board and configured to divide an interior of the shielded cabinet into a plurality of shielded regions.

6. The radio frequency amplifier assembly of claim 5, wherein the shield shielded regions comprise a first shielded region dedicated for enclosing cables and connectors.

7. The radio frequency amplifier assembly of claim 5, wherein the shield shielded regions comprise a second shielded region enclosing a driver of the radio frequency signal processing circuit and a third shielded region enclosing a final stage and a directional coupler of the radio frequency signal processing circuit.

8. The radio frequency amplifier assembly of claim 1, wherein the electrically conductive housing is configured to be grounded.

9. A magnetic resonance imaging system comprising a radio frequency amplifier assembly according to claim 1.

10. A method for assembling a radio frequency amplifier, the method comprising:
    disposing an electrically conductive cooling plate inside an electrically conductive housing to divide an enclosed interior defined by the electrically conductive housing into a first enclosed region and a second enclosed region;
    disposing a radio frequency signal processing circuit board equipped with a radio frequency signal processing circuit on the first side of the electrically conductive cooling plate and in the first enclosed region; and
    disposing a power supply module and a controller module on the opposite second side of the electrically conductive cooling plate and in the second enclosed region.

11. The method of claim 10, further comprising:
    disposing a shielding enclosure on the electrically conductive cooling plate to enclose the radio frequency signal processing circuit board, wherein the shielding enclosure, the electrically conductive cooling plate and the radio frequency signal processing circuit board are integrally formed as a radio frequency shielded cabinet detachably mounted inside the electrically conductive housing.

12. The method of claim 11, further comprising:
    disposing a plurality of shielding bars on the radio frequency signal processing circuit board to divide an interior of the shielded cabinet into a plurality of shielded regions.

13. The method of claim 12, wherein the plurality of shielded regions comprises a first shielded region dedicated for enclosing cables and connectors.

14. The method of claim 10, further comprising:
    securing a grounding path between the radio frequency signal processing circuit and the electrically conductive housing, which is configured to shorten a ground connection for the radio frequency amplifier.

15. The method of claim 11, further comprising:
    grounding the electrically conductive housing.

* * * * *